United States Patent
Kaneko et al.

(10) Patent No.: US 7,264,908 B2
(45) Date of Patent: Sep. 4, 2007

(54) PHOTO MASK BLANK AND PHOTO MASK

(75) Inventors: Hideo Kaneko, Niigata (JP); Tetsushi Tsukamoto, Niigata (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 539 days.

(21) Appl. No.: 10/834,919

(22) Filed: Apr. 30, 2004

(65) Prior Publication Data
US 2004/0229136 A1 Nov. 18, 2004

(30) Foreign Application Priority Data
May 16, 2003 (JP) ............................. 2003-139242

(51) Int. Cl.
G03F 9/00 (2006.01)

(52) U.S. Cl. ............................................. 430/5

(58) Field of Classification Search .................. 430/5, 430/394; 428/428, 430
See application file for complete search history.

(56) References Cited

U.S. PATENT DOCUMENTS 6,919,146 B2 * 7/2005 Corliss et al. ................ 430/5
7,026,076 B2 * 4/2006 Wasson et al. ................ 430/5
7,118,832 B2 * 10/2006 Yan ............................... 430/5

FOREIGN PATENT DOCUMENTS

| JP | A 57-104141 | 6/1982 |
| JP | A 57-151945 | 9/1982 |
| JP | A 59-090853 | 5/1984 |
| JP | A 60-095437 | 5/1985 |

* cited by examiner

Primary Examiner—S. Rosasco
(74) Attorney, Agent, or Firm—Oliff & Berridge, PLC

(57) ABSTRACT

There is disclosed a photo mask blank comprising at least a light-shielding film containing Cr and one or more layers of an anti-reflection film disposed on a substrate, wherein at least one layer of the anti-reflection film contains any one selected from the group consisting of silicon oxide, silicon nitride and silicon oxynitride. And there is also disclosed a photo mask blank comprising at least a light-shielding film containing Cr and two or more layers of an anti-reflection film disposed on a substrate, wherein the anti-reflection film comprises at least a layer of film with high transmittance at exposure wavelength, and a layer of film with lower transmittance at exposure wavelength than that of the layer and higher transmittance at inspection wavelength than at that exposure wavelength. Thus, there can be provided a photo mask blank having an anti-reflection film that can sufficiently reduce reflectance even if the exposure wavelength is short.

7 Claims, 1 Drawing Sheet

PHOTO MASK BLANK AND PHOTO MASK

BACKGROUND OF THE INVENTION

1. Field of the Invention

The present invention relates to a photo mask blank and a photo mask preferably used in fine patterning for semiconductor integrated circuits, color filters for CCDs (charge coupled devices) and LCDs (liquid crystal displays) and magnetic heads and so forth.

2. Description of the Related Art

Photolithography technique utilizing a photo mask is used in fine patterning for high-density semiconductor integrated circuits such as LSIs, VLSIs, etc., color filters for CCDs (charge coupled devices) and LCDs (liquid crystal displays), and magnetic heads and so forth.

As the aforementioned photo mask, using a photo mask blank wherein a light-shielding film generally comprising chrome (Cr) is formed on a transparent substrate such as silica glass and aluminosilicate glass by sputtering method, vacuum evaporation method, etc., a desired pattern is formed on this light-shielding film to obtain the photo mask.

In fabrication of such a photo mask, a resist pattern is formed through the processes of, in order, coating a photo resist or an electron beam resist onto a photo mask blank wherein a light-shielding film is formed on a substrate, selectively exposing a desired pattern, developing, rinsing and drying. Subsequently, wet etching using an etchant containing a mixed aqueous solution of cerium ammonium nitrate and perchloric acid or dry etching using a chlorine gas is performed by using the resist pattern as a mask, the unmasked portion of chrome film has been removed, and then the resist is removed. Thereby, a photo mask in which a desired pattern with the light-shielding portions and light-transmitting portions can be produced.

In the case of using such a photo mask in lithography, because the reflectance of a Cr type light-shielding film is high, light reflected by a silicon wafer, etc. that are exposed objects travels through a projection lens, is reflected by the photo mask, and returns to the silicon wafer. In order to prevent such multiple reflection, normally an anti-reflection film is formed on the light-shielding film.

As a photo mask blank and photo mask having such an anti-reflection film, a photo mask blank in which a CrO film is formed as the anti-reflection film on the surface side of a Cr light-shielding film formed on a transparent substrate, and another anti-reflection film is formed at the interface between the Cr light-shielding film and the transparent substrate has been proposed (see, for example, Japanese Examined Publication No. S62-37385). And, an anti-reflection film using CrON has been disclosed (see, for example, Japanese Patent Nos. 1565243 and 1489613).

Also, using Cr (see, for example, Japanese Patent No. 1565243), CrC (see, for example, Japanese Patent No. 1420095), etc. for a light-shielding film is known.

Further, a mask blank in which a half-tone film is formed to increase resolution and a Cr film is formed thereon has been put into practice.

The reflectance of the blank is required to be low at exposure wavelength in order to prevent the above-mentioned multiple reflection between the photo mask and the exposed object such as a semiconductor substrate. On the other hand, with the market demand in recent years for higher integration in semiconductor integrated circuit etc., reduction in the minimum feature size of photo mask patterns has rapidly progressed. Such miniaturization has been achieved in part by the use of shorter wavelength exposure light. However, with the shortening of exposure wavelengths such as 248 nm, 193 nm and 157 nm, the problem has arisen that reflectance cannot be sufficiently reduced by an anti-reflection film using a Cr type film.

SUMMARY OF THE INVENTION

The present invention was conceived to solve the problem described above, the object of the present invention is to provide a photo mask blank and a photo mask having an anti-reflection film that can sufficiently reduce reflectance even when the exposure wavelength is short.

In order to achieve the above object, according to the present invention, there is provided a photo mask blank comprising at least a light-shielding film containing Cr and one or more layers of an anti-reflection film disposed on a substrate, wherein at least one layer of the anti-reflection film contains any one selected from the group consisting of silicon oxide, silicon nitride and silicon oxynitride.

In this manner, in a photo mask blank comprising the light-shielding film containing Cr and one or more layers of an anti-reflection film, if at least one layer of the anti-reflection film includes any one selected from the group consisting of silicon oxide, silicon nitride, or silicon oxynitride, then a photo mask blank that can sufficiently reduce reflectance even when exposure wavelength is short can be obtained.

According to the present invention, there is also provided a photo mask blank comprising at least a light-shielding film containing Cr and two or more layers of an anti-reflection film disposed on a substrate, wherein the anti-reflection film comprising at least a first layer of film with high transmittance at exposure wavelength and a second layer of film with lower transmittance at exposure wavelength than that of the first layer and higher transmittance at inspection wavelength than that at exposure wavelength.

In this manner, if it includes a light-shielding film containing Cr and an anti-reflection film having two or more layers, the anti-reflection comprising at least a layer of film with high transmittance at the exposure wavelength and a layer of film with lower transmittance than that of the layer with high transmittance at the exposure wavelength but higher at the inspection wavelength than at the exposure wavelength, the total reflectance of the photo mask blank will become low at exposure wavelength. Therefore, it has excellent characteristics when used in photolithography, and it can achieve sufficient sensitivity for defect inspections, etc because a desired reflectance can be attained at the inspection wavelength.

In this case, the anti-reflection film preferably comprises at least a layer of film containing any one selected from the group consisting of silicon oxide, silicon nitride and silicon oxynitride and a layer of film containing Cr.

As described above, if the anti-reflection film consists of a layer of film containing any one selected from the group consisting of silicon oxide, silicon nitride and silicon oxynitride and a layer of film containing Cr, the total reflectance of the photo mask blank can be low even when the exposure wavelength is short by using the layer of film containing silicon oxide, silicon nitride or silicon oxynitride, and a desired reflectance can be attained at the inspection wavelength by using the layer of film containing Cr. Thereby, sufficient sensitivity for defect inspections, etc. can be achieved.

In this case, the reflectance at the exposure wavelength is preferably 12% or less.

In this way, if the reflectance at the exposure wavelength is 12% or less, it is preferable because, for example, the above-described multiple reflection between the photo mask and the exposed object such as a silicon wafer can be sufficiently prevented.

In this case, the exposure wavelength is preferably 248 nm or less, more preferably 193 nm or less.

Since the photo mask blank of the present invention can reduce reflectance even if the exposure wavelength is short wavelength, it can prevent multiple reflection between the photo mask and the exposed objects when used in photolithography, and precisely form a desired fine pattern. Therefore, higher integration and miniaturization in semiconductor integrated circuit devices and so forth can be sufficiently achieved.

In this case, the reflectance at the inspection wavelength is preferably from 10 to 20%.

If the reflectance at the inspection wavelength is from 10 to 20%, desired reflectance and sufficient sensitivity could be achieved even at inspection wavelengths in defect inspections, for example. As a result, inspection of blanks can be performed with accuracy.

And, the present invention provides a photo mask wherein a pattern is formed on the light-shielding film of the photo mask blank of the present invention.

Because the photo mask blank of the present invention has low reflectance even when the exposure wavelength is short, the photo mask wherein a pattern is formed on the blank can precisely form a desired fine pattern by photolithography. Therefore, higher integration and miniaturization in semiconductor integrated circuit devices and so forth can be sufficiently achieved.

As described hereinabove, according to the present invention, a photo mask blank and photo mask having a light-shielding film comprising Cr wherein the reflectance is low even when the exposure wavelength is short can be achieved. Further, at inspection wavelengths, the desired reflectance necessary for inspections can be attained.

DETAILED DESCRIPTION OF THE PREFERRED EMBODIMENTS

Figure 1:
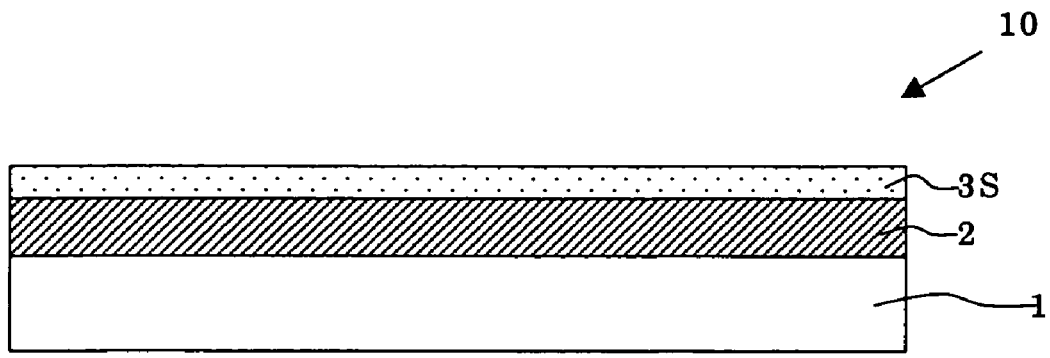
FIG. 1 is a drawing showing an example of the structure of a photo mask blank of the present invention.

Embodiments of the present invention will be described in detail hereinafter with referring to the drawings, although the present invention is not limited thereto.

As a result of thorough investigations with the purpose of solving the above problem, the inventors of the present invention have provided the present invention, which can achieve a low reflectance even when the exposure wavelength is short by using a film containing any one selected from the group consisting of silicon oxide, silicon nitride and silicon oxynitride for the anti-reflection film. Further it can attain desired reflectance at the inspection wavelength for defect inspections, etc. by means of a two-layer structure of the anti-reflection film and a film containing Cr.

FIG. 1 is a drawing showing an example of the structure of a photo mask blank of the present invention. In the photo mask blank 10 of the present invention, a Cr light-shielding film 2 comprising Cr is formed on a substrate 1. In the present invention, an Si type anti-reflection film 3S containing any one selected from the group consisting of silicon oxide, silicon nitride and silicon oxynitride is formed on the Cr light-shielding film 2, in place of a conventional Cr type anti-reflection film comprising CrO, CrON, and so forth.

Generally, an anti-reflection film reduces reflectance at specific wavelength by utilizing the interference effect of multiple reflection in the film. That is, it reduces reflection intensity by utilizing interference between light traveling back and forth in the anti-reflection film and light reflected at the surface. However, as the absorption coefficient of the anti-reflection film increases, light attenuates while traveling back and forth in the film, and the anti-reflection film can not perform its function any longer. Although a film comprising CrO, CrON, CronC, etc. is generally used in photo mask blank, these have a large absorption coefficient at short wavelength and therefore cannot sufficiently reduce reflectance.

Here, the inventors of the present invention conceived the use of a film containing any one selected from the group consisting of silicon oxide, silicon nitride and silicon oxynitride for the anti-reflection film. As described above, normally a film comprising CrO, CrON, etc. has been used as the anti-reflection film of the photo mask blank having a Cr type light-shielding film. However, by using a film containing any one selected from the group consisting of silicon oxide, silicon nitride and silicon oxynitride as the anti-reflection film, chemical resistance while keeping excellent chemical resistance, the absorptance of the anti-reflection film at short wavelength can be reduced and the effect of multiple reflection in the film sufficiently increases. Therefore, the reflectance of the film can be reduced.

On the other hand, as the inspection light for defect inspections, etc., generally light with longer wavelength than exposure wavelength is used. For example, in the case of a photo mask in which the exposure wavelength is 193 nm or 248 nm, wavelength of approximately 365 nm is used. At this inspection, wavelength reflectance of 10 to 20% is necessary to achieve sufficient sensitivity.

For this reason, if the anti-reflection film is formed as a single layer film as shown in FIG. 1, there are cases where, even if reflectance can be controlled to some extent at the exposure wavelength, it is difficult to control reflectance at the inspection wavelength within the desired range.

In such a case, reflectance at the inspection wavelength can be controlled within the desired range by forming two or more layers of anti-reflection film.

Figure 3:
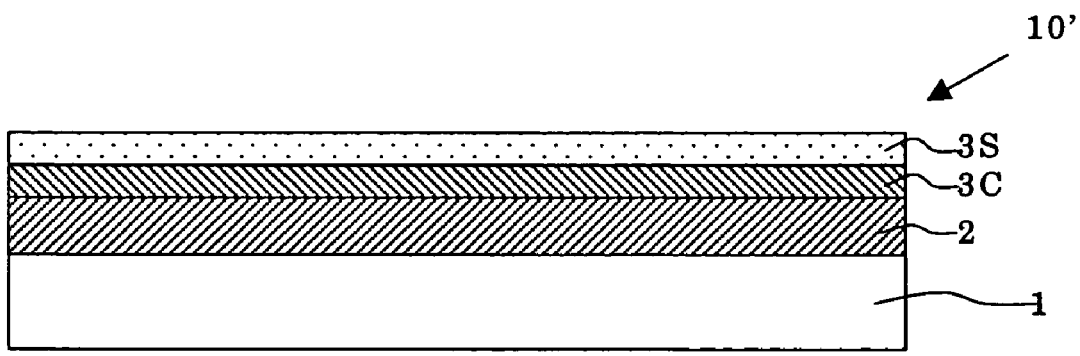
FIG. 3 is a drawing showing the structure of another photo mask blank of the present invention.

FIG. 3 is a drawing showing an example of the structure of another photo mask blank of the present invention. In this photo mask blank 10', a Cr light-shielding film 2 comprising Cr is formed on a substrate 1. Then, on the Cr light-shielding film 2, a Cr type anti-reflection film 3C containing Cr and an Si type anti-reflection film 3S containing any one selected from the group consisting of silicon oxide, silicon nitride and silicon oxynitride are sequentially formed. The Si type anti-reflection film 3S has high transmittance at the exposure wavelength, and the Cr type anti-reflection film 3C act as a film with lower transmittance than that of 3S at the exposure wavelength and with higher transmittance at the inspection wavelength than that at the exposure wavelength. Thereby, the total reflectance of the photo mask blank 10' is low at exposure wavelength of short wavelength and the desired range necessary for inspection at inspection wavelength of long wavelength.

As the structure of the anti-reflection film, as shown in FIG. 3, the film 3S with high transmittance and large anti-reflection effect at short wavelength (exposure wavelength) can be disposed on the surface side, and the film 3C that has lower transmittance than that of 3S at short wavelengths and higher transmittance at long wavelength (inspection wavelength) than that at short wavelength can be disposed on the substrate side. On the contrary, the film 3S with the large anti-reflection effect at short wavelengths can be disposed on the substrate side, and the film 3C with lower transmittance at short wavelength than 3S and higher transmittance at long wavelength than short wavelength can be disposed on the surface side. However, it is easier to design a film with the film having the large anti-reflection effect at short wavelength on the surface.

Although there is no particular limit to the exposure wavelength applicable to the photo mask blank and the photo mask of the present invention, a large effect can be obtained at 248 nm or less, in particular at 193 nm or less.

Further, in order to be able to reduce multiple reflection between the mask and the exposed object such as a silicon wafer, lower reflectance of the photo mask blank at exposure wavelength is preferable, for example, the reflectance is preferably 15% or less, more preferably 12% or less, even more preferably 10% or less.

This type of photo mask blank of the present invention can be produced by sequentially forming a light-shielding film and an anti-reflection film on the substrate by means of reactive sputtering technique, and so forth using Si and Cr as targets.

A direct current (DC) power supply or a radio-frequency (RF) power supply may be employed in the sputtering process. Either a magnetron sputtering system, a conventional system, or other systems may be used. Further, the coating apparatus can be either an in-line type or a single-wafer processing type.

Specifically, when forming the light-shielding film comprising Cr, for example, the Cr film is deposited by sputtering onto a transparent substrate such as quartz using Cr as a target and Ar as a sputtering gas.

When depositing for example a CrONC film as an anti-reflection film containing Cr, Cr is used as a target, and either a gas mixture of a gas containing oxygen such as $CO_2$ or $O_2$, a gas containing nitrogen such as $N_2$ or $NO_2$, and a gas containing carbon such as $CH_4$ or $CO_2$, or a gas mixture in which an inert gas such as Ar mixes with the gas mixture is used as a sputtering gas.

When depositing an anti-reflection film containing any one selected from the group consisting of silicon oxide, silicon nitride and silicon oxynitride, Si is used as a target. As a reactive gas for sputtering, a gas containing oxygen such as $O_2$ is used when depositing silicon oxide, a gas containing nitrogen such as $N_2$ is used when depositing silicon nitride, and a gas mixture of a gas containing nitrogen such as $N_2$ or $NO_2$ and a gas containing oxygen such as $O_2$ is used when depositing silicon oxynitride. Or, a gas mixture in which an inert gas such as Ar mixes with each reactive gas is used as a sputtering gas.

Figure 2:
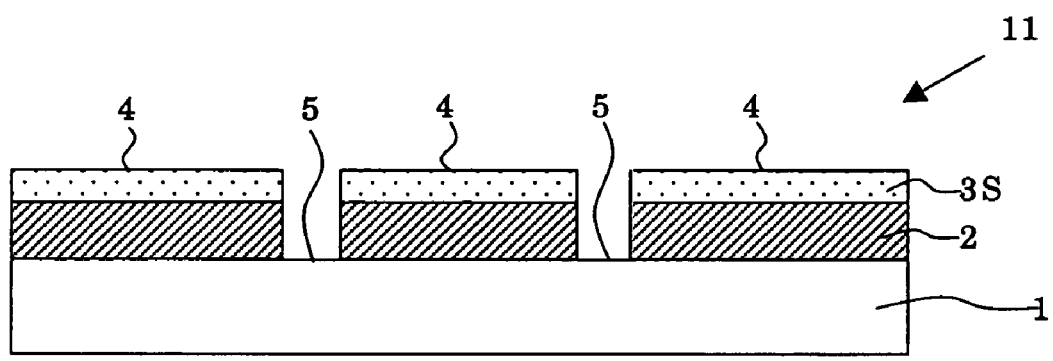
FIG. 2 is a drawing showing an example of the structure of a photo mask of the present invention.

By forming a pattern by means of lithography on the light-shielding film of the photo mask blank of the present invention obtained in this way, as shown in FIG. 2 for example, the mask 11 of the present invention in which light-shielding portions 4 and light-transmitting portions 6 are formed on the photo mask blank shown in FIG. 1 can be produced.

In this case, processes in the photolithography such as coating of a resist film, patterning (exposure and developing), dry etching or wet etching and removal of the resist film can be performed by known methods.

EXAMPLES

Hereinafter, the present invention will be explained more specifically by giving an example and a comparative example, although the present invention is not limited thereto.

Example 1

A Cr light-shielding film of 70 nm thick was formed on a quartz substrate of six inches square by DC sputtering technique using Cr as a target and Ar as a sputtering gas at pressure of 0.3 Pa during discharge, discharge power of 250 W, and deposition temperature of 120° C. Next, an anti-reflection film comprising CrONC of 12 nm thick was formed on the Cr light-shielding film using Cr as a target and using Ar, $CO_2$ and $N_2$ as sputtering gases. Then, an anti-reflection film comprising SiN of 8 nm thick was formed on the CrONC film using Si as a target and Ar and $N_2$ as sputtering gases, and thereby a photo mask blank was manufactured.

Incidentally, another sample with only an SiN film formed on a quartz substrate was made, and the absorption coefficients of the SiN film were measured. The absorption coefficients of the SiN film were 0.3 or less at the wavelength of 193 nm, less than 0.1 at the wavelength of 248 nm, and less than 0.1 at the wavelength of 365 nm. Also, a sample with only a CrONC film formed on a quartz substrate, and the absorption coefficients of the CrONC film were measured. The absorption coefficients of the CrONC film were more than 1.2 at the wavelength of 193 nm, 1.1 at the wavelength of 248 nm, and 0.8 at the wavelength of 365 nm.

The reflectance of the photo mask blank obtained was measured at the wavelengths of 193 nm, 248 nm, and 365 nm, respectively. As the result, reflectance at the wavelength of 193 nm was 5%, reflectance at the wavelength of 248 nm was 4%, and reflectance at the wavelength of 365 nm was 14%.

As described above, the photo mask blank of the embodiment of the present invention can be found to have low reflectance even at short wavelength so that it has an excellent anti-reflection effect. On the other hand, at long wavelength such as inspection wavelength, it is found possible to achieve sufficient sensitivity for the inspection.

Comparative Example 1

A Cr light-shielding film was formed on a quartz substrate of six inches square in the same manner as Example 1. Next, only an anti-reflection film comprising CrONC was formed on the Cr light-shielding film using Cr as a target and using Ar, $CO_2$ and $N_2$ as sputtering gases, and thereby a photo mask blank was obtained.

The reflectance of the photo mask blank obtained was measured at wavelengths of 193 nm, 248 nm, and 365 nm. As the result, reflectance at the wavelength of 193 nm was 23%, reflectance at the wavelength of 248 nm was 17%, and reflectance at the wavelength of 365 nm was 13%.

As described above, the photo mask blank of the comparative example could be found to have high reflectance at the short wavelength that corresponds to exposure wavelength, and bad anti-reflection effect.

The present invention is not limited to the above embodiments. The above embodiments are simply illustrative. A photo mask blank and a photo mask having the same constitution as the technical idea described in the claims of the present invention, and providing the similar actions and effects are all included in the scope of the present invention.

For example, although an example in a case of a single layer of the anti-reflection film containing any one selected from the group consisting of silicon oxide, silicon nitride and silicon oxynitride was explained above, two or more layers of the anti-reflection film can be disposed. Also, the anti-reflection film is not limited to a case where it is formed on the light-shielding film, and can be disposed on both sides of the light-shielding film.

What is claimed is:

1. A photo mask blank comprising at least a light-shielding film containing Cr and two or more layers of an anti-reflection film disposed on a substrate, wherein the anti-reflection film comprises at least a first layer of film with high transmittance at exposure wavelength, and a second layer of film with lower transmittance at the exposure wavelength than that of the first layer and higher transmittance at inspection wavelength than that at the exposure wavelength.

2. The photo mask blank according to claim 1, wherein the first layer of film contains any one selected from the group consisting of silicon oxide, silicon nitride and silicon oxynitride and the second layer of film contains Cr.

3. The photo mask blank according to claim 1, wherein the reflectance at the exposure wavelength is 12% or less.

4. The photo mask blank according to claim 1, wherein the exposure wavelength is 248 nm or less.

5. The photo mask blank according to claim 1, wherein the exposure wavelength is 193 nm or less.

6. The photo mask blank according to claim 1, wherein the reflectance at the inspection wavelength is from 10 to 20%.

7. A photo mask comprising a pattern is formed on the light-shielding film of the photo mask blank according to claim 1.

* * * * *